United States Patent
Li et al.

(10) Patent No.: US 7,928,773 B2
(45) Date of Patent: Apr. 19, 2011

(54) MULTIPLE FREQUENCY SYNCHRONIZED PHASE CLOCK GENERATOR

(75) Inventors: Yi Li, Shanghai (CN); Ji Fu Chi, Shanghai (CN)

(73) Assignee: Integrated Device Technology, Inc, San Jose, CA (US)

( * ) Notice: Subject to any disclaimer, the term of this patent is extended or adjusted under 35 U.S.C. 154(b) by 215 days.

(21) Appl. No.: 12/169,631

(22) Filed: Jul. 9, 2008

(65) Prior Publication Data

US 2010/0007389 A1 Jan. 14, 2010

(51) Int. Cl.
*H03B 21/00* (2006.01)

(52) U.S. Cl. ......... 327/107; 327/144; 327/294; 327/299

(58) Field of Classification Search ................... 327/105, 327/107, 144–146, 149, 151–153, 155, 158, 327/160–163, 291–299
See application file for complete search history.

(56) References Cited

U.S. PATENT DOCUMENTS

| | | | | |
|---|---|---|---|---|
| 4,677,499 A * | 6/1987 | Shirota et al. | ................... | 386/89 |
| 5,187,722 A | 2/1993 | Petty | | |
| 5,432,823 A * | 7/1995 | Gasbarro et al. | ............. | 375/356 |
| 5,463,337 A * | 10/1995 | Leonowich | ................... | 327/158 |
| 6,114,915 A * | 9/2000 | Huang et al. | ................... | 331/25 |
| 6,121,816 A | 9/2000 | Tonks et al. | | |
| 6,650,160 B2 * | 11/2003 | Tanahashi | ................... | 327/277 |
| 6,798,258 B2 * | 9/2004 | Rieven | ................... | 327/152 |
| 6,970,028 B2 * | 11/2005 | Ishikawa | ................... | 327/158 |
| 7,210,052 B2 * | 4/2007 | Lee et al. | ................... | 713/500 |
| 2004/0061545 A1 * | 4/2004 | Iorga | ................... | 327/408 |
| 2008/0162975 A1 * | 7/2008 | Chen | ................... | 713/501 |
| 2009/0039867 A1 * | 2/2009 | Saint-Laurent et al. | ...... | 324/102 |

OTHER PUBLICATIONS

Fenghao Mu et al., "Digital Multiphase Clock/Pattern Generator," IEEE Journal of Solid-State Circuits, vol. 34, Issue 2, Feb. 1999, pp. 182-191.
Allen, D.J. et al., "Free Running Ring Frequency Synthesizer," Solid-State Circuits Conference (ISSCC) Feb. 6-9, 2006, pp. 1502-1511.

* cited by examiner

*Primary Examiner* — Lincoln Donovan
*Assistant Examiner* — William Hernandez
(74) *Attorney, Agent, or Firm* — Tracy Parris

(57) ABSTRACT

Generation of multiple clocks having a synchronized phase relationship may reduce the size, complexity, power consumption, jitter and cost of circuitry while improving its functionality, performance, reliability and fault coverage. A multiple frequency clock generator may comprise an independent digital control oscillator (DCO) for generating a first clock and dependent DCOs for generating additional clocks that align at a common multiple frequency with the first clock with or without adjustment thereof. The independent and dependent DCOs may generate the first and additional clocks from a delay lock loop (DLL) by selecting a sequence of tap select signals. Tap select signals may be adjusted to maintain a desired phase and/or frequency of the first and additional clocks. Dependent DCOs may generate sequences of tap select signals based on the sequence of tap select signals generated by the independent DCO to incorporate adjustments, e.g., PLL error corrections.

20 Claims, 6 Drawing Sheets

MULTIPLE FREQUENCY SYNCHRONIZED PHASE CLOCK GENERATOR

TECHNICAL FIELD

The present invention generally relates to clock generation. More particularly, the invention relates to the generation of multiple clocks having a synchronized phase relationship.

BACKGROUND

Telecommunication and other systems often require multiple clocks. While design requirements vary among systems, it is generally desirable for clock generators to minimize cost, power consumption, circuitry dimensions, complexity and jitter, among other factors having a negative impact, and to maximize functionality, performance, reliability and fault coverage, among other factors having a positive impact. Known clock generators achieve varying degrees of success with regard to such factors. Various embodiments of the present invention address some or all of the shortcomings of known multiple frequency clock generators.

SUMMARY

This Summary is provided to introduce concepts in a simplified form. These concepts are described in greater detail below in the section entitled Detailed Description Of Illustrative Embodiments. This Summary is not intended to identify key or essential features of the claimed subject matter, nor limit the scope thereof.

The present invention provides for generation of multiple clocks having a synchronized phase relationship. A multiple frequency clock generator in accordance with some embodiments of the invention may comprise, for example, an independent digital control oscillator (DCO) for generating a first clock; and a dependent DCO, dependent on the independent DCO, for generating a second clock, wherein the first and second clocks align at their common multiple frequency with and without adjustment. The independent and dependent clocks may be generated from one in the same source. In some embodiments, a delay lock loop (DLL) may generate a delayed clock having a delay selected in time increments by a tap select signal, wherein the independent DCO and dependent DCO, respectively, generate the first and second clocks from the delayed clock by selecting a sequence of tap select signals. The dependent DCO may generate a sequence of tap select signals based on the sequence of tap select signals generated by the independent DCO. The sequence of tap select signals generated by the independent and dependent DCOs may be adjusted to maintain a desired phase and/or frequency of the first and second clocks. Such adjustments may be propagated from the independent DCO to dependent DCOs.

A phase lock loop (PLL) in accordance with some embodiments of the invention may comprise, for example, a detector for determining an error between a reference and a feedback; a multiple frequency clock generator comprising: an independent DCO for generating a first clock; and a dependent DCO, dependent on the independent DCO, for generating a second clock, where the first and second clocks align at their common multiple frequency with and without adjustment. The error is provided to the multiple frequency clock generator for adjustment to correct the error. The feedback may comprise a feedback signal selected from a plurality of signals comprising the first clock and second clock. The independent DCO may receive the error and may adjust the sequence of tap select signals it selects to correct the error. The dependent DCO may base the sequence of tap select signals it generates on the error-adjusted sequence of tap select signals generated by the independent DCO.

A method in accordance with some embodiments of the invention may comprise, for example, generating a clock synthesis source selectable by a tap select signal, e.g., to select the output of a DLL; generating a first clock by selecting a first sequence of tap select signals; and generating a second clock by selecting a second sequence of tap select signals based on the first sequence of tap select signals, wherein the first and second clocks align at their common multiple frequency with and without adjustment of the first clock.

Generation of multiple clocks having a synchronized phase relationship irrespective of adjustment, at least in some implementations, may reduce or completely overcome one or more of the problems associated with other clock generators pertaining to cost, power consumption, circuitry dimensions, complexity and jitter, functionality, performance, reliability and fault coverage, among other factors.

BRIEF DESCRIPTION OF THE DRAWINGS

The foregoing summary, as well as the following detailed description, is better understood when read in conjunction with the accompanying drawings. For the purpose of illustrating various aspects of multiple frequency synchronous phase clock generation, there is shown in the drawings exemplary implementations thereof. However, multiple frequency synchronous phase clock generation is not limited to the specific implementations disclosed herein.

DETAILED DESCRIPTION OF ILLUSTRATIVE EMBODIMENTS

Figure 1:
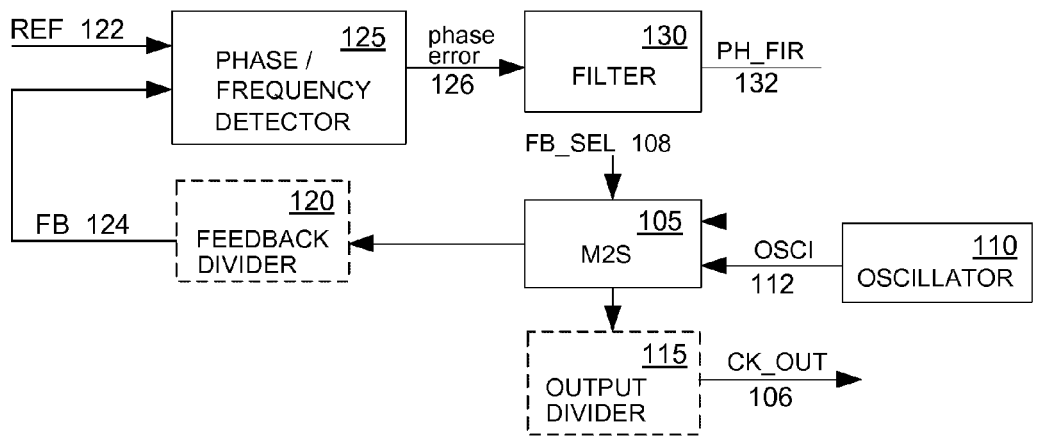
FIG. 1, in accordance with some embodiments of the invention, illustrates a block diagram of an exemplary environment in which multiple frequency synchronous phase clock generation can be implemented.

Reference will now be made to embodiments of the present technology for automated clock relationship detection, examples of which are illustrated in the accompanying drawings. While the technology for automated clock relationship detection will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

Unless specifically stated otherwise, terms such as "sampling", "latching", "determining", "storing", "registering", "creating", "including", "comparing", "receiving", "providing", "generating", "associating", and "arranging", or the like, refer to the actions and processes of an electronic device that manipulates and transforms data represented as physical (electronic) quantities within the electronic device.

Certain terms are used throughout the following description and claims to refer to particular system components and configurations. As one skilled in the art will appreciate, companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or though an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components.

The present invention provides for generation of multiple clocks having a synchronized phase relationship. A multiple frequency clock generator in accordance with some embodiments of the invention may comprise, for example, an independent digital control oscillator (DCO) for generating a first clock; and a dependent DCO, dependent on the independent DCO, for generating a second clock, wherein the first and second clocks align at their common multiple frequency with and without adjustment. The independent and dependent clocks may be generated from one in the same source. In some embodiments, a delay lock loop (DLL) may generate a delayed clock having a delay selected in time increments by a tap select signal, wherein the independent DCO and dependent DCO, respectively, generate the first and second clocks from the delayed clock by selecting a sequence of tap select signals. The dependent DCO may generate a sequence of tap select signals based on the sequence of tap select signals generated by the independent DCO. The sequence of tap select signals generated by the independent and dependent DCOs may be adjusted to maintain a desired phase and/or frequency of the first and second clocks. Such adjustments may be propagated from the independent DCO to dependent DCOs.

A phase lock loop (PLL) in accordance with some embodiments of the invention may comprise, for example, a detector for determining an error between a reference and a feedback; a multiple frequency clock generator comprising: an independent DCO for generating a first clock; and a dependent DCO, dependent on the independent DCO, for generating a second clock, where the first and second clocks align at their common multiple frequency with and without adjustment. The error is provided to the multiple frequency clock generator for adjustment to correct the error. The feedback may comprise a feedback signal selected from a plurality of signals comprising the first clock and second clock. The independent DCO may receive the error and may adjust the sequence of tap select signals it selects to correct the error. The dependent DCO may base the sequence of tap select signals it generates on the error-adjusted sequence of tap select signals generated by the independent DCO.

A method in accordance with some embodiments of the invention may comprise, for example, generating a clock synthesis source selectable by a tap select signal, e.g., to select the output of a DLL; generating a first clock by selecting a first sequence of tap select signals; and generating a second clock by selecting a second sequence of tap select signals based on the first sequence of tap select signals, wherein the first and second clocks align at their common multiple frequency with and without adjustment of the first clock.

FIG. 1, in accordance with some embodiments of the invention, illustrates a block diagram of one exemplary environment, among many, in which multiple frequency synchronous phase clock generation can be implemented. As illustrated in FIG. 1, exemplary phase lock loop (PLL) circuit 100 comprises multiple frequency synchronous phase clock generator (referred to as M2S or M²S for Multiphase Master and Slave clock generator) 105, oscillator 110, optional output divider 115, optional feedback divider 120, phase/frequency detector (PFD) 125 and filter 130. PLL circuit 100 may be implemented in hardware or a combination of hardware and software. The hardware may comprise analog circuitry, digital circuitry, or a combination of both, which may include software instructions executed by a processor in the case of digital circuitry.

Optional output divider 115, optional feedback divider 120, phase/frequency detector (PFD) 125 and filter 130 may comprise known components in known digital or analog PLL circuits. PFD 125 receives as inputs reference clock (REF) 122 from a reference source (not shown) and feedback clock (FB) 124 from M2S 105. FB 124, provided by M2S 105, may be divided by optional feedback divider 120 such as when the frequency of FB 124 is a multiple of the frequency of REF 122. PFD 125 compares the phase difference between REF 122 and FB 124 according to a predetermined transfer function and generates, as a result of that comparison, phase error 126. Filter 130, which may be a low pass filter, attenuates phase error 126, resulting in PH_FIR 132. Inputs to M2S 105 include PH_FIR 132, OSCI 112 generated by oscillator 110, and FB_SEL 108. Input clock OSCI 112 is used by M2S 105 to produce a plurality of clocks. PH_FIR 132 is used by M2S 105 to adjust clock generation to lock to REF 122. FB_SEL 108 is used by M2S 105 to select a particular signal to feedback to PFD 125. Outputs of M2S 105 include output clock CK_OUT 106, which may include a plurality of clocks generated by M2S 105. One or more of these clocks may be divided by optional output divider 115. As previously mentioned, another output of M2S 105 is FB 124, which may be divided by optional feedback divider 120.

Input clock OSCI 112 is used by M2S 105 to generate a plurality of phase synchronous clocks, i.e., output clock(s) CK_OUT 106. For example, assume REF 122 is a 1.544 MHz clock and at least one desired output frequency, e.g., CK_OUT 106 is 2.048 MHz. Rather than divide these clocks to a common multiple frequency of 8 KHz for comparison, a phase synchronous 1.544 MHz clock can be generated by M2S 105 along with 2.048 MHz from the same input clock OSCI 112. The 1.544 MHz clock can be selected by FB_SEL 108 as FB 124 while it may also be output with the 2.048 MHz clock as CK_OUT 106. As such, any frequency or phase adjustment established based on the 1.544 MHz clock used as FB 124 can be observed in both the 2.048 MHz and 1.544 MHz clocks generated by M2S 105. M2S 105 permits the avoidance of multiple clock generators as well as clock division and associated jitter alias.

Figure 2:
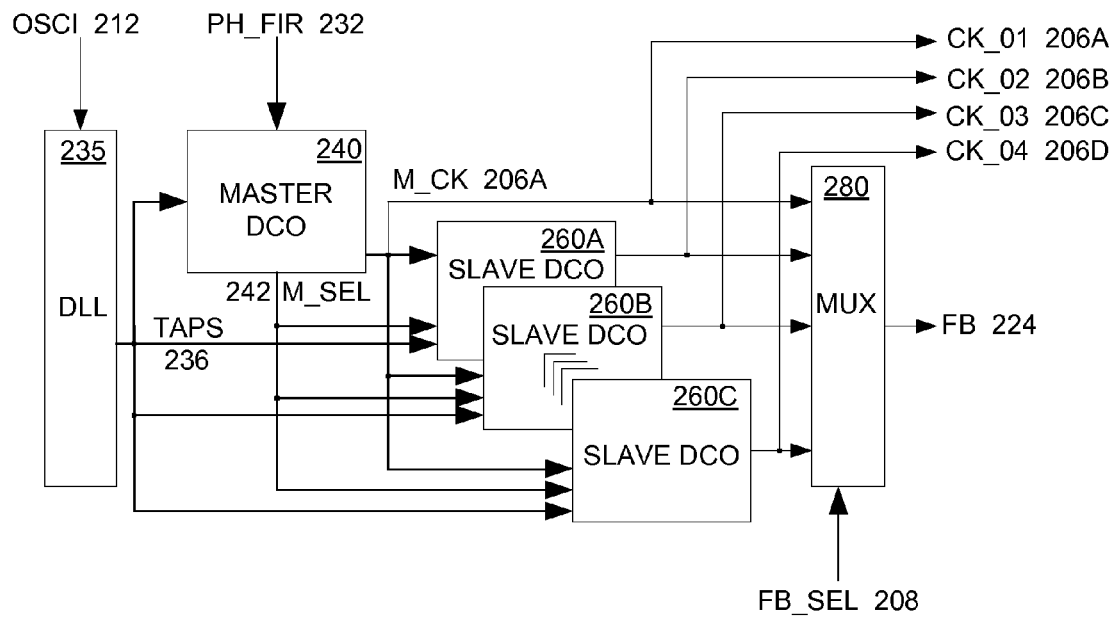
FIG. 2, in accordance with some embodiments of the invention, illustrates an exemplary implementation of multiple frequency synchronous phase clock generation.

FIG. 2, in accordance with some embodiments of the invention, illustrates an exemplary implementation of multiple frequency synchronous phase clock generation. FIG. 2 illustrates one embodiment of M2S 105. While M2S 105 may be variously implemented in hardware (digital, analog or both) or a combination of hardware and software, in the embodiments presented herein, M2S 105 will generally be presented as digital circuitry.

Figure 3:
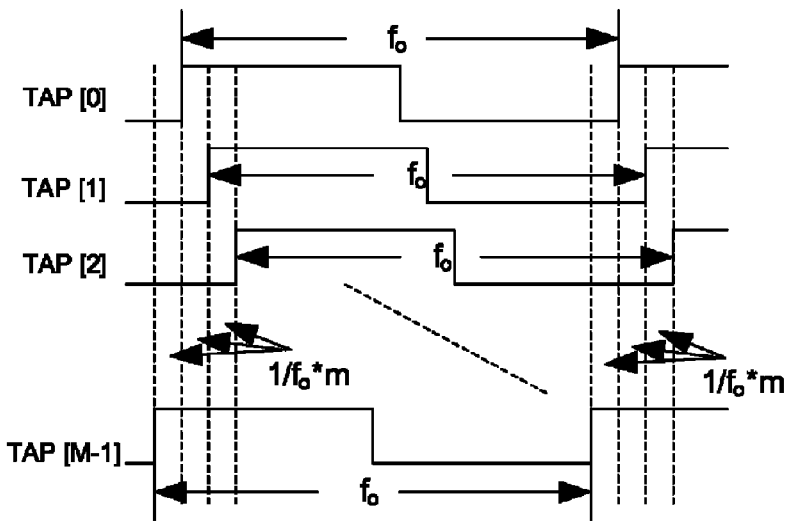
FIG. 3 illustrates a diagram of exemplary output of a delay lock loop illustrated in FIG. 2.

As illustrated in FIG. 2, M2S 205 comprises delay lock loop (DLL) 235, independent or master digital control oscillator (DCO) 240, dependent or slave DCOs 260A-C and multiplexer MUX 280. DLL 235 is one example of a clock synthesis source of the multiphase generator variety. DLL 235, as with any suitable clock synthesis source, can be used by master DCO 240 and slave DCOs 260A-C to synthesize a plurality of synchronized clocks. DLL 235 receives and uses input clock OSCI 212 to generate and output a plurality of taps 236. In the case of DLL 235, taps 236 are a plurality of delayed input clocks, i.e., phase shifts of input clock OSCI 212. The delay or phase shift tau (τ) between each tap may, but need not be, equal. It is determined by input clock OSCI 212 and the number of taps 236. In the embodiments described herein, it is presumed that the delay or phase shift τ between taps is the same increment. Reference may be made to FIG. 3 for a better understanding of taps 236.

FIG. 3 illustrates a diagram of exemplary output of DLL 235 illustrated in FIG. 2. The number of taps, m, generated by DLL 235 may be selected depending on the particular output frequencies needed and design requirements, e.g., tolerances. In the embodiments discussed herein, the number of taps used is 64, i.e., m=64. Although the number of bits required to address 64 taps is six, DLL 235 may be able to provide more or fewer addressable taps. DLL 235 may be programmable. The number of taps may vary widely among embodiments. For example, in some embodiments the number of taps may be 128 requiring seven bit addressing, while in other embodiments the number of taps may be 256, requiring 8-bit addressing. The number of taps generally depends on design requirements. If the phase shift increment τ between each tap is the same, then the phase shift or delay time τ between each tap will be given by Equation 1:

$$\tau = 1/f_o * m)$$ Equation 1 where $f_o$ is the frequency of input clock OSCI 212 and m is the number of taps of DLL 235. For example, if input clock OSCI 212 has a frequency $f_o$ equal to 20 MHz with a period of 50 nanoseconds (nS) and the number of taps generated by DLL 235 is 64, then per Equation 1 the phase shift or delay time τ between each tap is 0.78125 nS. Thus, each of 64 taps generated by DLL 235 would have the same frequency $f_o$ equal to 20 MHz with a period of 50 nS, but the rising and falling edges of each tap would be delayed by 0.78125 nS relative to rising and falling edges in an adjacent tap. In other words, the 64 taps combined generate a rising edge every 0.78125 nS. The equivalent frequency of a clock having a period of 0.78125 nS is 1.28 GHz. As illustrated in FIG. 3, the rising edge of tap [m−1] or tap [63] in this example is one incremental delay, e.g., 0.78125 nS, from the rising edge of tap [0]. A variety of frequencies, including any necessary phase or frequency adjustments, may be synthesized by selecting taps to provide a rising edge at a desired time. Of course the duty cycle of a clock synthesized in such a way may vary from 50% if taps are not also selected to provide a falling edge in the synthesized clock to maintain a particular duty cycle. As such, taps may be selected for both their rising and falling edges to synthesize a desired clock having a desired duty cycle.

Taps 236 output by DLL 235 may be selected by tap select signals generated by master DCO 240 as well as slave DCOs 260A-C. As illustrated in FIG. 2, the master clock tap select signal M_SEL 242 is used internally by master DCO 240 and is also provided to slave DCOs 260A-C to pass on any phase or frequency adjustments from control signals such as PH_FIR 232. M_SEL 242 may comprise any number of bits necessary to address the number of taps output by DLL 235. For example, the number of bits necessary to address 64 taps, i.e., taps 0 through 63, is 6 bits.

Master DCO 240 and each slave DCO 260A-C are each configured to synthesize a clock having a particular frequency. Although three slave DCOs 260A-C are illustrated in FIG. 2, there may be as few or as many slave DCOs as required by particular embodiments. Although not necessary in all embodiments, master DCO 240 may be selected in some embodiments to synthesize the highest frequency clock. Further, some embodiments may comprise a plurality of sets of master and slave DCOs. The output clock generated by master DCO 240 is output clock CK_01 206A, also referred to herein as master clock M_CK 206A. This clock is provided to slave DCOs 260A-C. In some embodiments, additional signals or clocks may be provided from master DCO 240 to slave DCOs 260A-C, e.g., a delayed master clock. The output clocks generated by slave DCOs 260A-C are output clocks 206B-D.

As illustrated in FIG. 1, any, all or none of output clocks 206A-D may be divided by optional output divider 115. As illustrated by multiplexer MUX 280 and feedback selector FB_SEL 208, any of output clocks 206A-D may be selected as feedback clock FB 224. The most suitable output clock 206A-D relative to reference clock REF 122 may be selected by FB_SEL 208 as feedback clock FB 124. The output clock selected as feedback clock FB 124 may be selected, for example, because it is the same frequency as reference clock REF 122 or its closest multiple. If a slave clock, e.g., any of output clocks 206B-D, is selected as FB 124 then an adjustment may be necessary to provide the proper control signal PH_FIR 232 to master DCO 240. The proportional adjustment between master clock M_CK 206A and the selected slave clock, e.g., any of output clocks 206B-D, may be made in any one of several components, including filter 130. As illustrated in FIG. 1, feedback clock FB 124 may be divided by optional feedback divider 120 if necessary. Selection of input clock OSCI 212 and the number of taps 236 output by DLL 235 may be helpful in avoiding division. In some embodiments, input clock OSCI 212 and the number of taps may be dynamically variable while in others they may be static.

In some embodiments, master DCO 240 may be controlled by external inputs such as phase/frequency control signal PH_FIR 232. In the embodiment shown, master DCO 240 provides this external control information to slave DCOs 260A-C through signals it provides to slave DCOs 260A-C, such as but not limited to master clock tap selector M_SEL 242 and output clock CK_01 206A, also referred to herein as master clock M_CK 206A. Thus, regardless which output clock 206A-D is selected as feedback clock FB 224, in the embodiment shown, master DCO 240 receives phase and/or frequency adjustment information directly through PH_FIR 232 and slave DCOs 260A-C receive the information indirectly from master DCO 260. In some embodiments a slave clock is used as feedback clock FB 224 and only master DCO 240 is controlled directly by PH_FIR 232. In such embodiments, a coefficient calculated based on the proportion between this slave clock and master clock M_CK 206A may need to be applied so that PH_FIR 232 accurately controls the phase and/or frequency of master clock M_CK 206A. In other embodiments, external control signals may be provided directly to each slave DCO 260A-C, albeit with a coefficient applied relative to the clock used to determine PH_FIR 232.

M2S 205 may have multiple operating modes. In some embodiments, there may be two operating modes: ideal and normal. In ideal mode, master and slave clocks are free-running without being locked to reference clock REF 122. In normal mode, master and slave clocks are locked to reference clock REF 122, which may result in adjustments to the phase and/or frequency of master and slave clocks. In either mode, with or without adjustment, master and slave clocks are synchronous, i.e., they align at their common multiple frequency. In ideal status, master and slave clocks have a naturally synchronous phase relationship at their common multiple frequency $f_c$. Equation 2 shows this relationship:

$$\frac{\sum_{i=1}^{num\_m\_ck} period\_m\_ck\_ideal_i}{\sum_{j=1}^{num\_s\_ck} period\_s\_ck\_ideal_j} = 1 \qquad \text{Equation 2}$$

In Equation 2, the parameters 'num_m_ck' and 'num_s_ck' represent the number of cycles or periods of master clock and slave clock, respectively in one cycle of their common multiple frequency $f_c$.

Normal mode involves adjustments to lock master and slave clocks to a reference clock. When master clock and slave clock are aligned at their common multiple frequency $f_c$ in normal mode, the result is Equation 3:

$$\frac{\sum_{i=1}^{num\_m\_ck} (period\_m\_ck\_ideal + m*\tau)_i}{\sum_{j=1}^{num\_s\_ck} (period\_s\_ck\_ideal + n*\tau)_j} = 1 \qquad \text{Equation 3}$$

Figure 8:
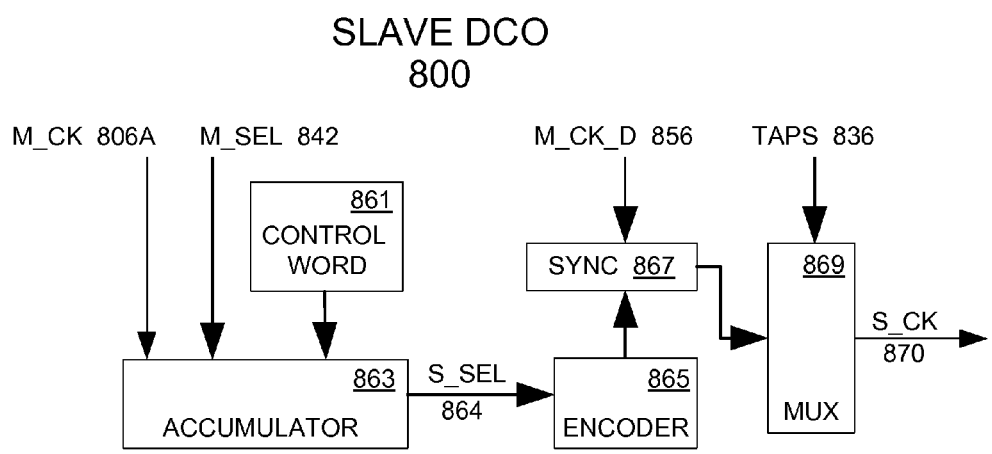
FIG. 8 illustrates an exemplary block diagram of a dependent digital control oscillator illustrated in FIG. 2.

In Equation 3, phase adjustments are indicated by n*τ and m*τ, respectively, in every master clock and slave clock period, where n and m are integers. Tau τ represents the minimum valid adjusting step of the DCO, i.e., the incremental tap delay such as 0.78125 nS for each of 64 taps of a 20 MHz input clock. Thus, n represents master clock tap select M_SEL 242 while m represents slave clock tap select S_SEL (as shown in FIG. 8). Substituting Equation 2 into Equation 3 results in Equation 4:

$$\sum_{i=1}^{num\_m\_ck} (n \cdot \tau)_i = \sum_{j=1}^{num\_s\_ck} (m \cdot \tau)_j \qquad \text{Equation 4}$$

When master and slave clocks are not the same frequency, a necessary adjustment to master clock will not be the same as a necessary adjustment to slave clock. Therefore, as shown in the foregoing equations, in order to maintain a synchronous relationship between master and slave clocks in normal mode each slave clock tap select S_SEL is determined by adding two parameters. The first parameter is the master clock tap select M_SEL 242 indicating the position of the rising edge of master clock M_CK 206A, which incorporates any phase adjustment information. The second parameter is the expected, free-running tap select interval between each rising edge of master clock and slave clock in ideal mode so as to maintain the rising edge relationship between master and slave clocks despite adjustments. This interval, to be discussed in greater detail later, is referred to as the integer delay interval between master and slave clocks D_MS. When these two parameters are added, the result is the accurate, synchronous slave clock rising edge position information incorporating phase adjusted information propagated to slave DCOs 260A-C through master DCO 240 via M_SEL 242.

In describing the embodiment shown in FIG. 2 in greater detail, it is helpful to refer to a specific example. PLL 100 or M2S 105 alone may be utilized in numerous applications including telecommunications. There are numerous standard operating frequencies in telecommunications, including T1, E1 and C6 specified by American National Standards Institute (ANSI) standard T1.101-1999 ("Synchronization Interface Standard"), revised by ATIS-PP-0900101.2006, and European Telecommunication Standard (ETS)300 011 ("Integrated Services Digital Network"). The data transmission/reception requirements of these standards requires that T1, E1 and C6 align with (i.e. be synchronized with) a framer signal whose frequency is a common multiple thereof. Using these standard frequencies as an example, master clock M_CK or CK_01 206A is 32.768 MHz (E1), CK_02 206B is 24.704 MHz (T1), CK_03 206C is 25.248 MHz (C6) and CK_04 206D is unused as is slave DCO 260C. Thus, master DCO 240 will operate to select taps 236 to synthesize a 32.768 MHz clock, slave DCO 260A will operate to select taps 236 to synthesize a 24.704 MHz clock and slave DCO 260B will operate to select taps 236 to synthesize a 25.248 MHz clock. In this example, it is assumed that input clock OSCI 212 has a frequency of 20 MHz, DLL 235 outputs 64 taps 236 having the same incremental delay of 0.78125 nS and M_SEL 242 is 6 bits to address 64 tap selects 0-63. The three frequencies can be translated into a specific number of incremental delays or taps. In the case of the 32.768 MHz (E1) clock having a period of 30.5175 nS, there are 39.0625 or 39 1/16 taps, where each tap is successively delayed by 0.78125 nS. In the case of the 24.704 MHz (T1) clock having a period of 40.4792 nS, there are 51 157/193 taps. In the case of the 25.248 MHz (C6) clock having a period of 39.6070 nS, there are 50 550/789 taps. The integer number of taps representing a period of master clock is referred to herein as the width of master clock or width_m_ck while the integer number of taps representing a period of a slave clock is referred to herein as the width of slave clock or width_s_ck. Given the fractional tap portions of master and slave clocks, width_m_ck and width_s_ck will vary over time. For example, width_m ck is 39, except every 16$^{th}$ cycle of master clock it is 40.

Table 1 illustrates the operation of master DCO 240 to select among taps 0-63 output by DLL 235 in order to synthesize E1 clock at 32.768 MHz, whose period of 30.5175 nS is equivalent to 39 1/16 taps 236. As shown in Table 1, there is a running accumulation of 39 1/16 taps, including the integer 39 and fraction 1/16. In this embodiment, master DCO 240 selects, via M_SEL 242, every 39$^{th}$ tap in taps 236 for 15 cycles and the 40$^{th}$ tap in taps 236 for every 16$^{th}$ cycle of the synthesized E1 clock. After reset, tap [0] is the first tap 236 selected by M_SEL 242. The second tap 236 selected is tap [39]. The third tap 236 selected is tap [14], which is 39 taps following tap [39] considering that the tap following tap [63] is tap [0]. The fourth tap 236 selected is tap [53], the fifth is tap [28] and so on. The example shown in Table 1 is also illustrated, in part, in FIG. 4 and again in FIG. 11.

TABLE 1

| Clock Cycle | Tap Accumulation | M_SEL |
|---|---|---|
| 0 | 0 | Tap [0] |
| 1 | 39 (1/16) | Tap [39] |
| 2 | 14 (2/16) | Tap [14] |
| 3 | 53 (3/16) | Tap [53] |
| 4 | 28 (4/16) | Tap [28] |
| 5 | 3 (5/16) | Tap [3] |
| 6 | 42 (6/16) | Tap [42] |
| 7 | 17 (7/16) | Tap [17] |
| 8 | 56 (8/16) | Tap [56] |
| 9 | 31 (9/16) | Tap [31] |
| 10 | 6 (10/16) | Tap [6] |
| 11 | 45 (11/16) | Tap [45] |
| 12 | 20 (12/16) | Tap [20] |
| 13 | 59 (13/16) | Tap [59] |
| 14 | 34 (14/16) | Tap [34] |
| 15 | 9 (15/16) | Tap [9] |
| 16 | 49 | Tap [49] |
| ... | ... | ... |

Figure 4:
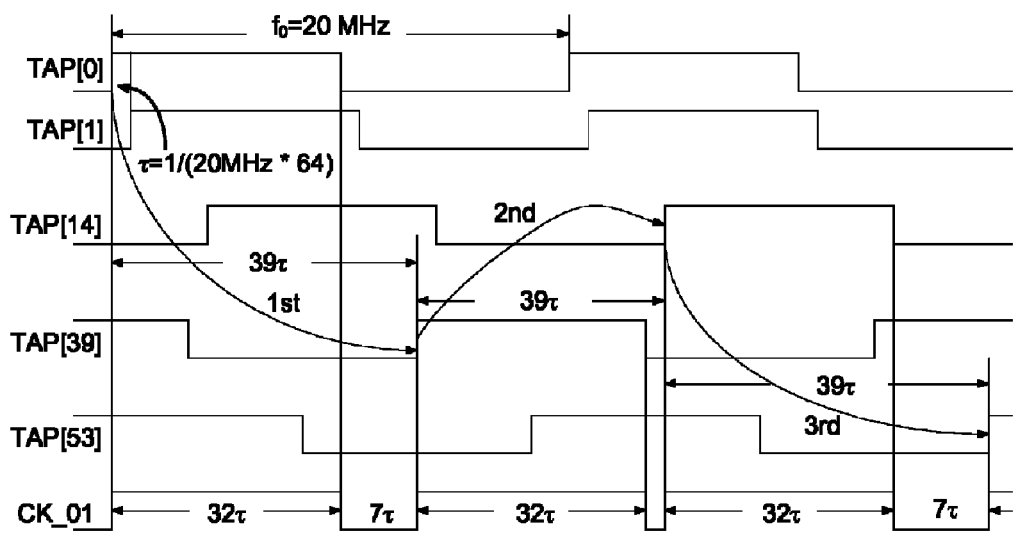
FIG. 4 illustrates an exemplary timing diagram for the exemplary generation of a clock by the independent digital control oscillator illustrated in FIG. 2 by selecting the exemplary output of the delay lock loop shown in FIG. 3.

FIG. 4 illustrates an exemplary timing diagram for the exemplary generation of a clock by the independent digital control oscillator illustrated in FIG. 2 by selecting the exemplary output of DLL 235 shown in FIG. 3. Specifically, although not drawn to scale (i.e. distorted) for purposes of clarity, FIG. 4 illustrates the first four tap selections in the example shown in Table 1, i.e., tap [0], tap [39], tap [14] and tap [53]. As shown in FIG. 3, the first four tap selections generate the first, second and third cycles of synthesized master clock M_CK 206A. Since M_SEL 242 only selects rising edges and not falling edges to control duty cycle in this embodiment, the duty cycle is not 50%. As illustrated in FIG. 4, each cycle, other than every 16$^{th}$ cycle, is high for 32 taps and low for 7 taps. Every 16$^{th}$ cycle is high for 32 taps and low for 8 taps. In this particular embodiment, if the period of M_CK 206A were 52 taps instead of 39 taps, the high portion of the period would be 32 taps while the low portion of the period would be 20 taps. The duty cycle may vary from one embodiment to the next.

Figure 5:
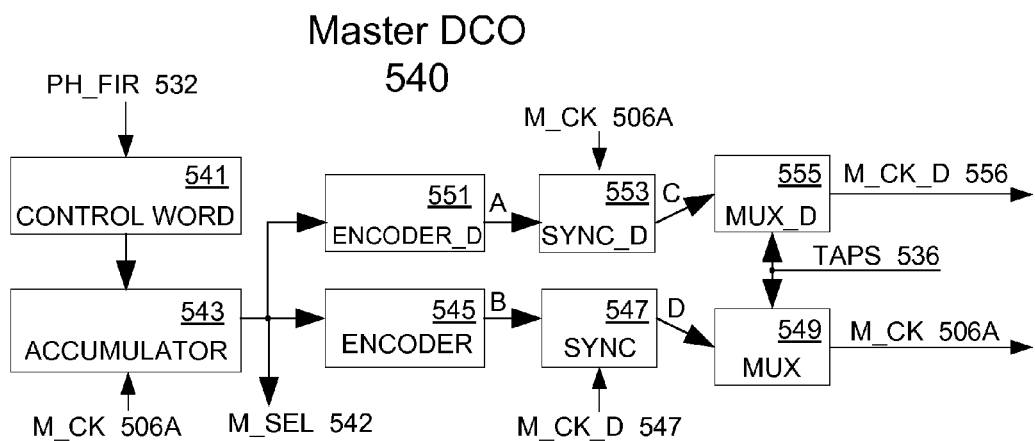
FIG. 5 illustrates an exemplary block diagram of an independent digital control oscillator illustrated in FIG. 2.

FIG. 5 illustrates an exemplary block diagram of independent or master DCO 240 illustrated in FIG. 2. As illustrated in this embodiment, master DCO 540 comprises control word 541, accumulator 543, encoder 545, synchronizer SYNC 547, multiplexer MUX 549, shifted or delayed encoder ENCODER_D 551, shifted or delayed synchronizer SYNC_D 553 and shifted or delayed multiplexer MUX_D 555. PH_FIR 532 is an input to control words 541. Control word 541 and master clock M_CK 506A are inputs to accumulator 543. The output of accumulator 543, i.e. M_SEL 542, is provided to encoder 545, delayed encoder 551 and slave DCOs 260A-C. Encoder 545 provides encoded signal B to synchronizer 547, which is clocked by delayed master clock M_CK_D 556. Synchronizer 547 provides a control signal D to multiplexer 549, which selects a particular tap from taps 536 to output as master clock M_CK 506A. Delayed encoder 551 provides delayed encoded signal A to delayed synchronizer 553, which is clocked by master clock M_CK 506A. Delayed synchronizer 553 provides a delayed control signal C to delayed multiplexer 555, which selects a particular tap from taps 536 to output as delayed master clock M_CK_D 556.

Generally, master DCO 540 generates master clock M_CK 506A, delayed master clock M_CK_D 556 and master tap select M_SEL 542 from input control signal PH_FIR 532 and input taps 536 using control word 541. In some embodiments, there may not be any control signals such as PH_FIR 532 while in other embodiments there may be other or additional control signals. In some embodiments, the falling edge of master clock M_CK 506A may be used instead of delayed master clock M_CK_D 556. Some of those embodiments may eliminate delayed encoder ENCODER_D 551, synchronizer SYNC_D 553 and multiplexer MUX_D 555 as well as modify other components to use the falling edge of master clock M_CK 506A. Where a delayed master clock is used, the delay may be based on, for example, settling times of combinational logic after the rising edge of master clock M_CK 206A.

Figure 6:
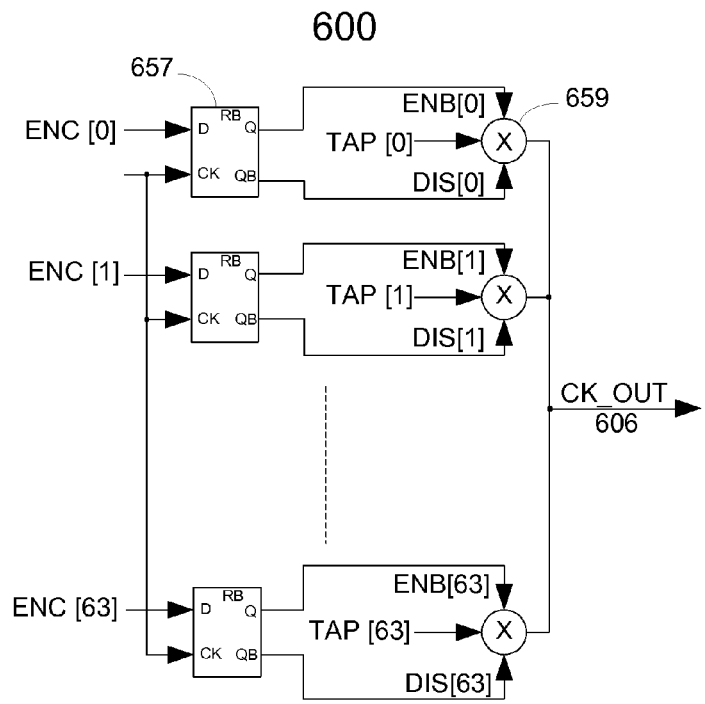
FIG. 6 illustrates an exemplary block diagram of the synchronizer and multiplexer illustrated in FIG. 5.

Accumulator 543 may be implemented in accordance with design requirements such as necessary accuracy and the number of taps. On each rising edge of master clock M_CK 506A, accumulator 543 adds control word 541 to determine the next master tap select M_SEL 542. Control word 541 comprises the number of taps per period of master clock M_CK 506A. For example, where master clock M_CK 206A is 32.768 MHz, input clock OSCI 212 is 20 MHz and DLL 235 outputs 64 taps, control word 541 would be 39 1/16. In other embodiments, control word 541 may store the predetermined integer width, i.e., integer number of taps, for each cycle of master clock M_CK 506A. For example, control word 541 may store 39 to be used for 15 cycles and 40 to be used for every 16th cycle. Obviously, what is stored by control word 541 may modify accumulator 543. Control word 541 may be modified by control signals such as PH_FIR 532. MSEL 542 is provided to encoder 545 and delayed encoder 551. Encoder 545 encodes MSEL 542 into one-hot format data to select one tap from taps 536. Delayed encoder 551 first delays or shifts MSEL 542 by a selected number of taps before encoding the delayed MSEL 542 into one-hot format. For example, if M_SEL 542 is tap [2] then delayed encoder 551 will shift to tap [4] prior to encoding. Therefore, delayed master clock M_CK_D 556 will have rising edges trailing the rising edges of master clock M_CK 506A. The delay or shift may vary from one embodiment to another. Rather than directly control mux 549 using one-hot encoded M_SEL 542, in some embodiments the one-hot encoded M_SEL 542 may first be synchronized. This may be necessary where, for example, decoders 545, 551 are combination logic requiring further stabilization to control multiplexers 549, 555. One embodiment of synchronization and multiplexing is illustrated in FIG. 6. FIG. 6 represents the combination of synchronizers 547 and multiplexer 549 or the combination of delayed synchronizer 553 and multiplexer 555.

FIG. 6 illustrates an exemplary block diagram of the synchronizer and multiplexer illustrated in FIG. 5. As illustrated in FIG. 6, the synchronization function is performed by 64 D-type flip flops 657, one for each tap 536, and the multiplexer function is performed by 64 transmission gates 659, one for each tap 536, with enable ENB and disable DIS signals. With respect to synchronizer 547 and multiplexer 549, one-hot encoded signals ENC[0] through ENC [63] are input to the D input of D-type flip flops 657, which are clocked by delayed master clock M_CK_D 556. As a result of the one-hot encoding, the output of only one D-type flip flop 657 will generate enable ENB and not disabled DIS signals to one transmission gate 659. This one enabled transmission gate will output CK_OUT 606, which is master clock M_CK 506A in this instance. With respect to delayed synchronizer 553 and multiplexer 555, delayed one-hot encoded signals ENC[0] through ENC [63] are input to the D input of D-type flip flops 657, which are clocked by master clock M_CK 506A. As a result of the one-hot encoding, the output of only one D-type flip flop 657 will generate enable ENB and not disabled DIS signals to one transmission gate 659. This one enabled transmission gate will output delayed master clock M_CK_D 556 in this instance.

Figure 7:
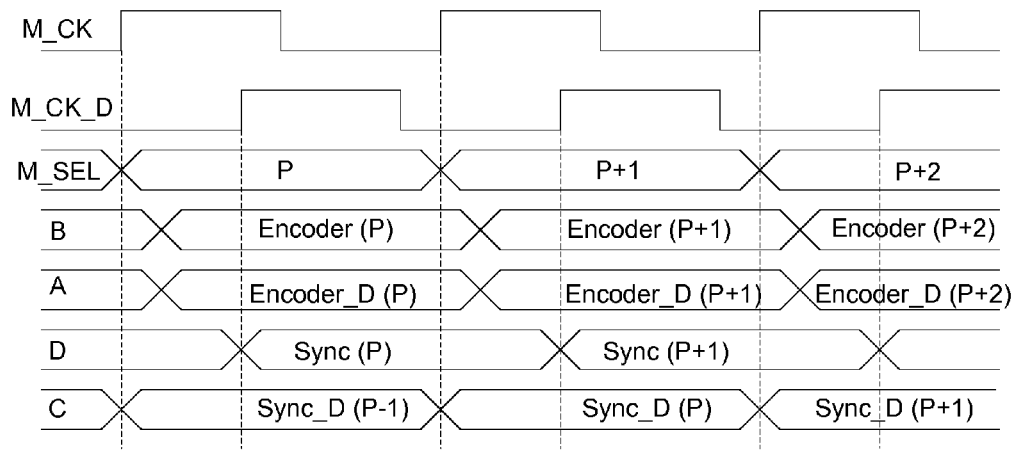
FIG. 7 illustrates an exemplary timing diagram for the exemplary implementation of multiple frequency synchronous phase clock generation illustrated in FIGS. 2, 5 and 6.

FIG. 7 illustrates an exemplary timing diagram for the exemplary implementation of multiple frequency synchronous phase clock generation illustrated in FIGS. 2, 5 and 6. More specifically, FIG. 7 illustrates an exemplary timing diagram of the operation of master DCO 540, as illustrated in FIGS. 5 and 6. In this illustration, P represents one period of master clock M_CK 506A. In FIG. 7, P refers to data from a current period of master clock M_CK 506A, P−1 refers to data from a preceding period of M_CK 506A and P+1 refers to data from a succeeding period of M_CK 506A. As shown, M_SEL 542 is output by accumulator 543 on the rising edge of master clock M_CK 506A. The combinational logic of decoder 545 and delayed decoder 551, indicated respectively as B and A, operate on M_SEL 542 and settle some time after the rising edge of master clock M_CK 506A. As indicated by D, synchronizer 547 clocks in the settled encoded tap select signal B on the rising edge of delayed master clock M_CK_D 556. As indicated by C, delayed synchronizer 553 clocks in the settled encoded delayed tap select signal A on the next rising edge of clock M_CK 506A.

FIG. 8 illustrates an exemplary block diagram of a dependent digital control oscillator, i.e., any one of slave DCOs 260A-C, illustrated in FIG. 2. Slave DCO 860 comprises control word 861, accumulator 863, encoder 865, synchronizer 867 and multiplexer 869. Accumulator 863 receives as input master tap select M_SEL 842, control word 861 and master clock M_CK 806A. Accumulator 863 generates and outputs slave tap select S_SEL 864. Encoder 865 receives slave tap select S_SEL 864 and outputs an encoded slave tap select signal. Synchronizer 867 synchronizes the encoded slave tap select signal. The synchronized encoded slave tap select signal controls multiplexer 869 to select one tap from taps 836 to output as slave clock S_CK 870. Multiplexer 869 outputs slave clock S_CK 870, which may be any one of output clocks 206A-C shown in FIG. 2.

Control word 861, encoder 865, synchronizer 867 and multiplexer 869 function similar to control word 541, encoder 545, synchronizer 547 and multiplexer 549 previously discussed with regard to FIGS. 5 and 6, except that they function for slave tap select S_SEL 864 and slave clock S_CK 870 instead of master tap select M_SEL 542 and master clock M_CK 506A. Control word 561 comprises the number of taps per period of slave clock S_CK 870. For example, where slave clock S_CK 206B or 870 is 24.704 MHz, input clock OSCI 212 is 20 MHz and DLL 235 outputs 64 taps, control word 861 would be 51 157/193. On each rising edge of master clock M_CK 806A, accumulator 863 adds control word 861 to determine the next slave tap select S_SEL 542. In other embodiments, control word 861 may store the predetermined integer width, i.e., integer number of taps, for each cycle of slave clock S_CK 870. What is stored in control word 861 may, of course, alter accumulator 863. In some embodiments, master tap select M_SEL 842 can be used to index the contents in control word 861. In some embodiments, instead of inputting control word 861 and M_SEL 842 into accumulator 863, control word 861 may be modified directly if master tap select M_SEL 842 has been modified by control signals such as PH_FIR 532.

Accumulator 863, which will be discussed in greater detail below, uses current master tap select M_SEL 842, which may include adjustments when operating in normal mode, and control word 861 to generate slave tap select S_SEL 864. Encoder 865 encodes slave tap select S_SEL 864 into a one-hot data format to select one tap from taps 836. This one-hot format slave tap select data is synchronized by synchronizer 867 before being applied to control multiplexer 869 to select one tap from taps 836 to output as slave clock S_CK 870. The operation of synchronizer 867 and multiplexer 869 is illustrated, for example, by FIG. 6.

Figure 9:
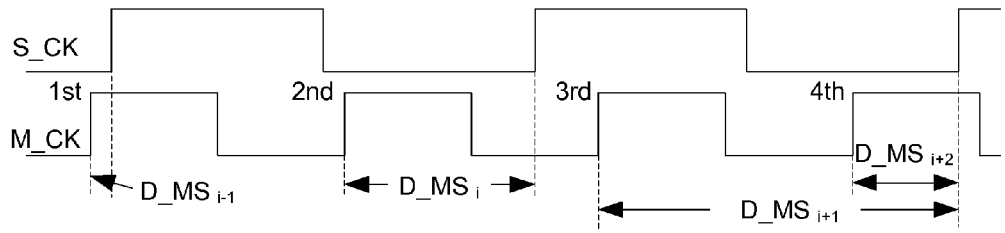
FIG. 9 illustrates an exemplary timing diagram of independent and dependent clocks and exemplary relationships between them.

When M2S 205 is being used in normal mode, i.e., in an environment that may apply clock adjustments, slave DCO 860 must maintain the relative phase relationship between master and slave clocks M_CK and S_CK despite the adjustments. Therefore, slave DCO 860 calculates the phase or delay relationship between master and slave clocks M_CK and S_CK on each rising edge of master clock M_CK. Slave DCO calculates the delay interval or distance between the rising edge of master clock M_CK and nearest following rising edge of slave clock S_CK. This measurement is referred to as D_MS. FIG. 9 illustrates an exemplary timing diagram of master and slave clocks M_CK and S_CK and accompanying measurements D_MS. There are four rising edges of master clock M_CK and four corresponding measurements D_MS. It can be seen that measurements $D\_MS_{i-1}$, $D\_MS_i$ and $D\_MS_{i+2}$ are each less than one period of master clock M_CK while measurement $D\_MS_{i+1}$ exceeds one period of master clock M_CK. Since D_MS measurements are based on the relationship between rising edges of master clock M_CK and slave clock S_CK in ideal mode irrespective of adjustments in normal mode, D_MS can be precalculated and stored in memory to load for operation. However, circuitry costs can be reduced by calculating D_MS every rising edge of master clock M_CK in real time, dynamically. The importance of measurements D_MS will become apparent during discussion of exemplary operation of accumulator 863.

Figure 10:
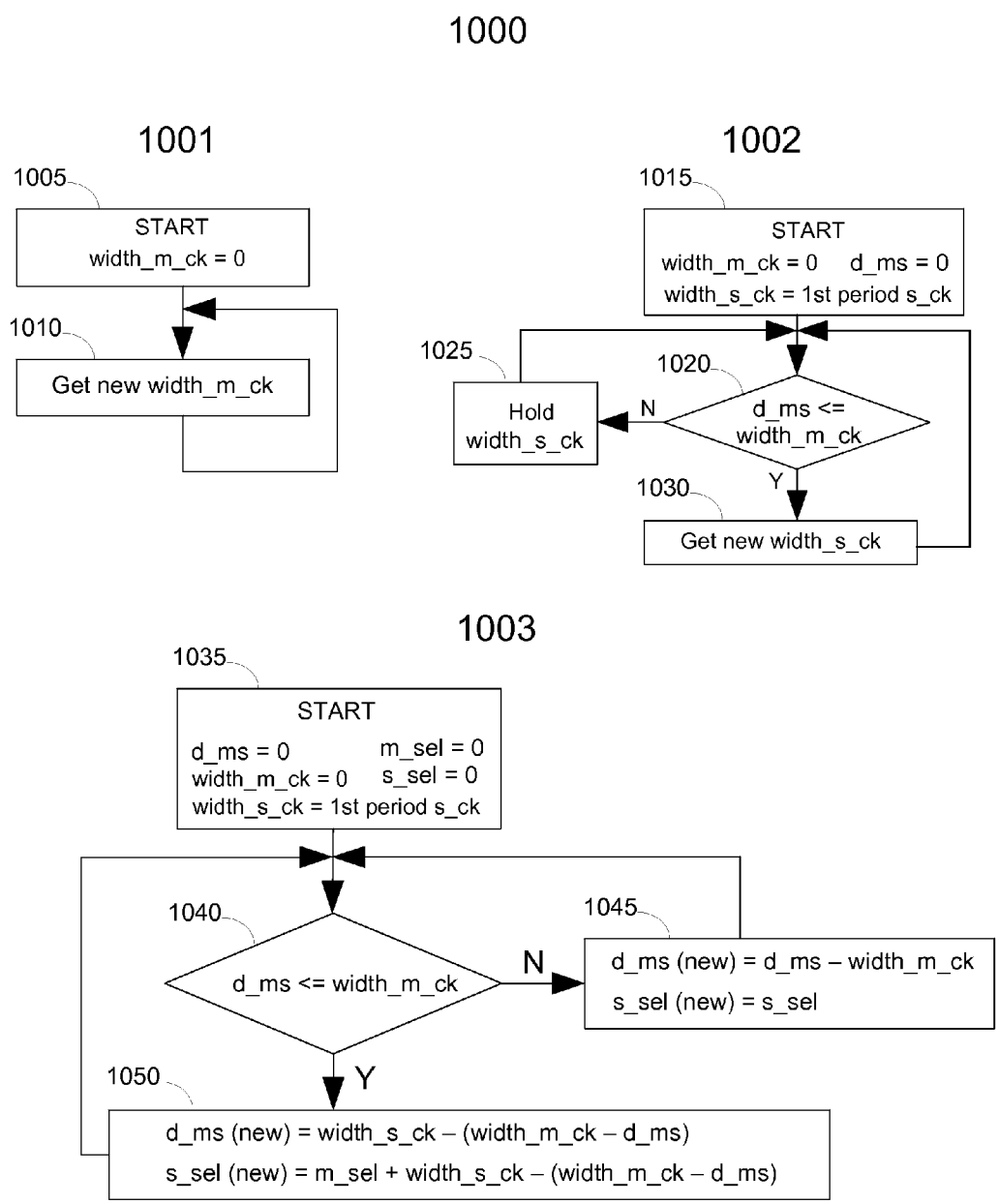
FIG. 10 illustrates an exemplary flow chart of exemplary operation of the accumulator block in the dependent digital control oscillator shown in FIGS. 2 and 8.

FIG. 10 illustrates an exemplary flow chart 1000 of exemplary operation of accumulator 863 in dependent or slave DCO 860. FIG. 10 illustrates three functions 1001, 1002, 1003. Each function occurs on the rising edge of master clock M_CK 806A. The first function 1001 determines the number of taps in the current period of master clock M_CK 806A, which is referred to as width_m_ck, in ideal mode. Initialization step 1005 initializes width_m_ck to zero. Following initialization 1005, step 1010 operates on every rising edge of master clock M_CK 806A to determine the number of taps in the current period of master clock M_CK 806A. This is accomplished by adding the control word for master clock M_CK 806A to its cumulative total and assigning the integer value of the cumulative total to width_m_ck. Continuing with the previous example, width_m_ck will be 39 for 15 periods then 40 every $16^{th}$ period of master clock M_CK 806A. In this embodiment, master tap select M_SEL propagates phase/frequency adjustments to slave tap select S_SEL. In some embodiments, adjustments may propagate through adjustments to width_m_ck, which may require modification of the algorithms in this embodiment.

The second function 1002 determines the number of taps in the current period of slave clock S_CK, which is referred to as width_s_ck, in ideal mode. Initialization step 1015 initializes width_m_ck to zero, width_s_ck to the number of taps in the first period of slave clock S_CK and the delay between master and slave clock D_MS to zero. Following initialization 1015, on every rising edge of master clock M_CK 806A, decision block 1020 determines whether D_MS is less than or equal to width_m_ck. Immediately after initialization 1015, the answer would be Yes, leading to step 1030. At step 1030, second function 1002 determines the number of taps in the current period of clave clock S_CK. This is accomplished by adding the control word for slave clock S_CK to its cumulative total and assigning the integer value of the cumulative total to width_s_ck. Continuing with the previous example, width_s_ck will be 51 for one period then 52 for four to five periods of slave clock S_CK. However, when D_MS (i.e. the delay or distance between rising edges of master and slave clocks M_CK and S_CK) is greater than width_m_ck, such as $D\_MS_{i+1}$ used by second function 1002 on the rising edge D of master clock M_CK in FIG. 9, then step 1025 holds width_s_ck at its previous value. As illustrated in FIG. 9, a new value of width_s_ck would be determined on the following rising edge E (not shown) of master clock M_CK because measurement $D\_MS_{i+2}$ is less than the period of master clock M_CK.

The third function 1003 determines the value of D_MS and, as the ultimate objective of slave accumulator 863, slave tap select S_SEL 864. Initialization step 1035 initializes width_m_ck to zero, width_s_ck to the number of taps in the first period of slave clock S_CK, delay between master and slave clock D_MS to zero, master tap select M_SEL to zero and slave tap select S_SEL to zero. Following initialization 1035, on every rising edge of master clock M_CK 806A, decision block 1040 determines whether D_MS is less than or equal to width_m_ck. Immediately after initialization 1035, the answer would be Yes, leading to step 1050. At step 1050, third function 1003 determines the delay between master and slave clock D_MS and slave tap select S_SEL using values of width_s_ck, width_m_ck, D_MS and M_SEL that were set prior to the rising edge of master clock M_CK that initiated comparison in decision block 1040.

The calculations of D_MS and S_SEL in step 1050 are given by Equations 5 and 6, respectively:

$$D\_MS(new)=width\_s\_ck-(width\_m\_ck-d\_ms) \quad \text{Equation 5}$$

$$S\_SEL(new)=M\_SEL+width\_s\_ck-(width\_m\_ck-d\_ms) \quad \text{Equation 6}$$

where width_m_ck is the number of taps per period of master clock M_CK, width_s_ck is the number of taps per period of slave clock S_CK, D_MS is the delay between a rising edge of master clock M_CK and subsequent rising edge of slave clock S_CK, M_SEL is the master clock tap select signal and S_SEL is the slave clock tap select signal. As previously noted, in this particular embodiment, phase and/or frequency adjustments to master clock M_CK are propagated to slave clock S_CK through master clock tap select M_SEL.

When D_MS is determined to be greater than width_m_ck in decision block 1040, then the third function 1003 proceeds to step 1045. In step 1045, slave clock tap select S_SEL is held at its previous value and D_MS is calculated according to Equation 7:

$$D\_MS(new)=D\_MS-width\_m\_ck \quad \text{Equation 7}$$

where width_m_ck is the number of taps per period of master clock M_CK and D_MS is the delay between a rising edge of master clock M_CK and subsequent rising edge of slave clock S_CK. The operation of functions 1001, 1002 and 1003 is illustrated in FIG. 11.

Figure 11:
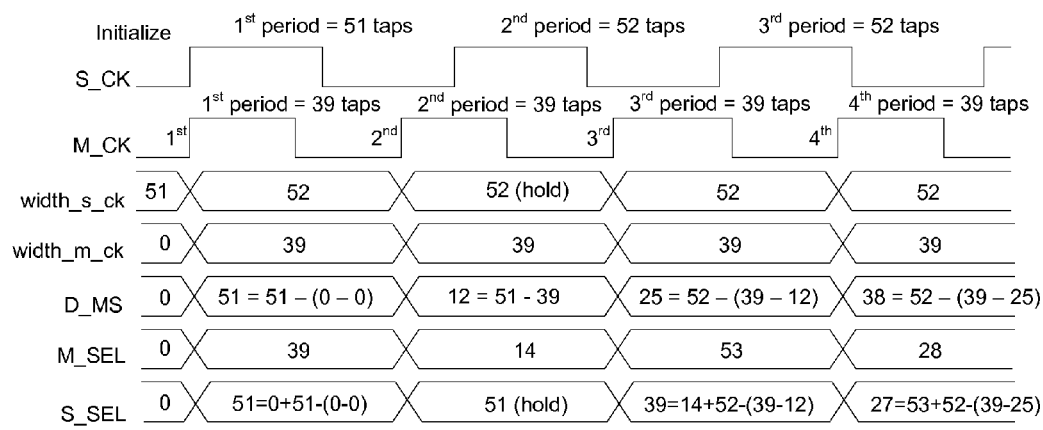
FIG. 11 illustrates an exemplary timing diagram for the exemplary implementation of multiple frequency synchronous phase clock generation illustrated in FIGS. 1-10.

FIG. 11 illustrates an exemplary timing diagram for the exemplary implementation of multiple frequency synchronous phase clock generation illustrated in FIGS. 1-10. FIG. 11 does not illustrate any phase adjustments. However, it can be seen how phase adjustments to master clock M_CK would propagate to slave clock S_CK. Continuing with the previous example where master clock M_CK is 32.768 MHz, at least one slave clock S_CK is 24.704 MHz, input clock OSCI is 20 MHz, DLL is set for 64 taps, resulting in 39 1/16 taps per period of master clock M_CK and 51 157/193 taps per period of slave clock S_CK, master clock M_CK and slave clock S_CK are illustrated with their respective integer number of taps per period, i.e., width_m_ck and width_s_ck. The rising edges of master clock M_CK are labeled $1^{st}$, $2^{nd}$, $3^{rd}$ and $4^{th}$. Initialization values are shown, i.e., width_s_ck=51, width_m_ck=0, D_MS=0, M_SEL=0 and S_SEL=0. There are 51 taps in the first period of slave clock S_CK.

As illustrated in FIG. 11, on the first rising edge of master clock M_CK, first function 1001, at step 1010, assigns the number of taps in the current period of master clock M_CK, i.e., 39 taps, to width_m_ck. On the first rising edge of master clock M_CK, second function 1002, at step 1020, determines that D_MS and width_m_ck are equal, since both were initialized at zero. As a result, step 1030 assigns the number of taps in the next period of slave clock S_CK, i.e., 52 taps, to width_s_ck. On the first rising edge of master clock M_CK, third function 1003, at step 1040, determines that D_MS and width_m_ck are equal, since both were initialized at zero. As a result, step 1050 determines the values of D_MS and S_SEL. As shown in FIG. 11, per Equation 5, D_MS is assigned a value of 51 because width_s_ck was initialized at 51 while width_m_ck and D_MS were initialized at zero. Following initialization, the value of M_SEL is provided by master DCO 540 per the output of accumulator 543, which accumulates the master clock control word, in this case 39 1/16 taps, on each rising edge of master clock M_CK. This is why M_SEL is 39 upon the first rising edge of master clock M_CK. On the first rising edge of master clock, M_CK, slave clock tap select S_SEL is determined by the values assigned to M_SEL, width_s_ck, width_m_ck and D_MS during initialization. As a result, per Equation 6, S_SEL is assigned a value of 51 because M_SEL, width_m_ck and D_MS were initialized at zero while width_s_ck was initialized at 51. In other words, following initialization selecting the tap 0, the next tap selected to synthesize slave clock S_CK from the 64 taps output by DLL 235 is tap 51. The rising edge output by tap 51 will provide the second rising edge of slave clock S_CK, tap 0 (i.e. no delay of the 20 MHz input clock) providing the first rising edge of slave clock S_CK.

As illustrated in FIG. 11, on the second rising edge of master clock M_CK, first function 1001, at step 1010, assigns the number of taps in the current period of master clock M_CK, i.e., 39 taps, to width_m_ck. On the second rising edge of master clock M_CK, second function 1002, at step 1020, determines that D_MS, equal to 51, is greater than width_m_ck, equal to 39. As a result, step 1025 holds the value of width_s_ck at its previous value of 52 taps. On the second rising edge of master clock M_CK, third function 1003, at step 1040, determines that D_MS, equal to 51, is greater than width_m_ck, equal to 39. As a result, step 1045 determines the values of D_MS and S_SEL. As shown in FIG. 11, per Equation 7, D_MS is assigned a value of 12 because the value of D_MS and width_m_ck prior to the second rising edge of master clock M_CK was 51 and 39, respectively, i.e.

51 less 39 is 12. Step 1045 also holds the value of slave tap select S_SEL at its previous value of 51. Thus, the rising edge output by tap 51 will provide the second rising edge of slave clock S_CK. This is shown by slave clock S_CK, which was initialized at tap zero and its next tap selection is tap 51, resulting in a width, width_s_ck, of 51 taps for the first period of slave clock S_CK.

As illustrated in FIG. 11, on the third rising edge of master clock M_CK, first function 1001, at step 1010, assigns the number of taps in the current period of master clock M_CK, i.e., 39 taps, to width_m_ck. On the third rising edge of master clock M_CK, second function 1002, at step 1020, determines that D_MS, which is 12, is less than width_m_ck, which is 39. As a result, step 1030 assigns the number of taps in the next period of slave clock S_CK, i.e., 52 taps, to width_s_ck. On the third rising edge of master clock M_CK, third function 1003, at step 1040, determines that D_MS, which is 12, is less than width_m_ck, which is 39. As a result, step 1050 determines the values of D_MS and S_SEL. As shown in FIG. 11, per Equation 5, D_MS is assigned a value of 25 per Equation 5 because, prior to the third rising edge of M_CK, width_s_ck was 52, width_m_ck was 39 and D_MS was 12. As shown in FIG. 11, per Equation 6, S_SEL is assigned a value of 39 per Equation 6 because, prior to the third rising edge of M_CK, M_SEL was 14, width_s_ck was 52, width_m_ck was 39 and D_MS was 12. Thus, the rising edge output by tap 39 will provide the third rising edge of slave clock S_CK.

As illustrated in FIG. 11, on the fourth rising edge of master clock M_CK, first function 1001, at step 1010, assigns the number of taps in the current period of master clock M_CK, i.e., 39 taps, to width_m_ck. On the fourth rising edge of master clock M_CK, second function 1002, at step 1020, determines that D_MS, which is 25, is less than width_m_ck, which is 39. As a result, step 1030 assigns the number of taps in the next period of slave clock S_CK, i.e., 52 taps, to width_s_ck. On the fourth rising edge of master clock M_CK, third function 1003, at step 1040, determines that D_MS, which is 25, is less than width_m_ck, which is 39. As a result, step 1050 determines the values of D_MS and S_SEL. As shown in FIG. 11, per Equation 5, D_MS is assigned a value of 38 per Equation 5 because, prior to the fourth rising edge of M_CK, width_s_ck was 52, width_m_ck was 39 and D_MS was 25. As shown in FIG. 11, per Equation 6, S_SEL is assigned a value of 27 per Equation 6 because, prior to the fourth rising edge of M_CK, M_SEL was 53, width_s_ck was 52, width_m_ck was 39 and D_MS was 25. Thus, the rising edge output by tap 27 will provide the fourth rising edge of slave clock S_CK.

It can be seen that functions/algorithms 1001, 1002 and 1003 operate in both ideal mode (free-running without adjustment) and normal mode (phase/frequency adjustments) to maintain synchronization between a plurality of clocks.

It can also be seen that embodiments may be implemented in one or more electronic devices or components therein. Embodiments may be implemented in hardware or a combination of hardware and software. For example, depending on the embodiment, any or all functions except clock generation, synchronization and multiplexing may be implemented in software comprising computer executable instructions stored on a computer readable storage medium that, when executed by a processor, accomplish the functionality described herein. Circuitry may be digital or analog. Analog to digital converters (ADCs) and digital to analog converters (DACs) may be used as transition/interface circuits for mixed implementations. For example, while M_SEL and S_SEL may be generated by digital circuitry, the synthesizing source (e.g., DLL), synchronization and multiplexing may be accomplished by analog circuitry. The analog and digital circuits may be interfaced by ADCs and DACs. Rather than calculate tap selections n real-time, tap selections or at least ideal-mode components of tap selections such as D_MS, width_m_ck and width_s_ck, may be pre-calculated, stored and retrieved as needed. S_SEL may be determined Further, the dependence of slave DCOs on a master DCO may vary from one embodiment to the next. For example, a plurality of DCOs may be essentially independent of one another, synthesizing various clocks from the same source. In order to avoid duplication of circuitry shown in FIG. 1, one of the clocks may be selected as FB 124. PH_FIR 132 may be provided directly to each DCO in FIG. 2 with a proportional adjustment depending on the proportion of frequency produced by each DCO relative to the clock selected as FB 124. This may require adjustment of the algorithms disclosed in the embodiment discussed herein, but the DCOs would remain dependent to some degree on the DCO that produces the clock selected as FB 124. Further, multiple M2S circuits may share one clock synthesizing source such as DLL 235.

Embodiments of the present invention may be utilized, for example, in a wide variety of telecommunication equipment across strata in plesiochronous digital hierarchy (PDH), synchronous optical networking (SONET) and synchronous digital hierarchy (SDH) networks. Embodiments of the present invention may be used to generate and synchronize a plurality of clocks, including framer signals, in equipment such as, but not limited to, a central office switch, multi-trunk digital loop carrier (DLC) or digital subscriber line access multiplexer (DSLAM), multi-trunk private branch exchange (PBX) or Internet protocol (IP) PBX and an enterprise router.

The inventions described herein provide numerous benefits. Generation of multiple clocks having a synchronized phase relationship with or without adjustments, at least in some implementations, may reduce or completely overcome one or more of the problems associated with other clock generators pertaining to cost, power consumption, circuitry dimensions, complexity and jitter, functionality, performance, reliability and fault coverage, among other factors.

While the present invention has been described with respect to a limited number of embodiments, those skilled in the art will appreciate numerous modifications and variations there from. It is intended that the appended claims cover all such modifications and variations as fall within the true spirit and scope of this present invention.

What is claimed:

1. A multiple frequency clock generator comprising:
    an independent digital control oscillator (DCO) for generating a first clock from a source; and
    a dependent DCO, dependent on at least one input received by the dependent DCO from the independent DCO, for generating a second clock from the source, wherein the first and second clocks align at their common multiple frequency with and without adjustment of the first clock.

2. The multiple frequency clock generator of claim 1, wherein the source comprises a delay lock loop (DLL) for generating a delayed clock having a delay selected in time increments by a tap select signal, wherein the independent DCO and dependent DCO, respectively, generate the first and second clocks from the delayed clock by selecting a sequence of tap select signals.

3. The multiple frequency clock generator of claim 2, wherein the dependent DCO receives the sequence of tap select signals generated by the independent DCO.

4. The multiple frequency clock generator of claim 3, wherein the sequence of tap select signals generated by the dependent DCO is based on the sequence of tap select signals generated by the independent DCO.

5. The multiple frequency clock generator of claim 2, wherein the sequence of tap select signals generated by the independent DCO can be adjusted to maintain a phase and/or frequency of the first clock.

6. The multiple frequency clock generator of claim 2, wherein the sequence of tap select signals generated by the dependent DCO can be adjusted to maintain a phase and/or frequency of the second clock.

7. The multiple frequency clock generator of claim 2, wherein the independent DCO generates a third clock comprising a delayed first clock to synchronize the sequence of tap select signals generated by the independent DCO.

8. The multiple frequency clock generator of claim 2, the first clock having rising and falling edges, wherein the independent DCO utilizes the falling edge of the first clock to synchronize the sequence of tap select signals generated by the independent DCO.

9. The multiple frequency clock generator of claim 2, wherein the sequence of tap select signals generated by the independent DCO are one-hot encoded.

10. A phase lock loop (PLL) comprising:
a detector for determining an error between a reference and a feedback;
a multiple frequency clock generator comprising:
an independent digital control oscillator (DCO) for generating a first clock from a source; and
a dependent DCO, dependent on at least one input received by the dependent DCO from the independent DCO, for generating a second clock from the source, wherein the first and second clocks align at their common multiple frequency with and without adjustment of the first clock and wherein the error is provided to the multiple frequency clock generator for adjustment to correct the error.

11. The PLL of claim 10, wherein the feedback comprises a feedback signal selected from a plurality of signals comprising the first clock and second clock.

12. The PLL of claim 11, wherein the feedback signal is adjusted relative to the reference before being provided as the feedback to the phase/frequency detector.

13. The PLL of claim 10, wherein the source comprises a delay lock loop (DLL) for generating a delayed clock having a delay selected in time increments by a tap select signal, wherein the independent DCO and dependent DCO, respectively, generate the first and second clocks from the delayed clock by selecting a sequence of tap select signals.

14. The PLL of claim 13, wherein the independent DCO receives the error and the sequence of tap select signals selected by the independent DCO is adjusted to correct the error.

15. The PLL of claim 14, wherein the dependent DCO receives the error-adjusted sequence of tap select signals generated by the independent DCO and wherein the sequence of tap select signals generated by the dependent DCO is based on the error-adjusted sequence of tap select signals generated by the independent DCO.

16. The PLL of claim 10, wherein the error is filtered.

17. A method comprising:
generating a clock synthesis source selectable by a tap select signal;
generating a first clock by selecting a first sequence of tap select signals; and
generating a second clock by selecting a second sequence of tap select signals based on the first sequence of tap select signals, wherein the first and second clocks align at their common multiple frequency with and without adjustment of the first clock.

18. The method of claim 17, wherein the step of generating a clock synthesis source is performed by a delay lock loop (DLL).

19. The method of claim 17, wherein the first sequence of tap select signals is adjustable to maintain a phase and/or frequency of the first clock.

20. The method of claim 19, further comprising:
selecting one of the first and second clocks as feedback in a phase lock loop (PLL).

* * * * *